(12) United States Patent
Kaya (10) Patent No.: US 9,467,097 B2
(45) Date of Patent: Oct. 11, 2016

(54) EDGE CORRECTION TO MITIGATE TOTAL HARMONIC DISTORTION IN CLASS D AMPLIFIER

(71) Applicant: TEXAS INSTRUMENTS INCORPORATED, Dallas, TX (US)

(72) Inventor: Cetin Kaya, Plano, TX (US)

(73) Assignee: TEXAS INSTRUMENTS INCORPORATION, Dallas, TX (US)

( * ) Notice: Subject to any disclaimer, the term of this patent is extended or adjusted under 35 U.S.C. 154(b) by 0 days.

(21) Appl. No.: 14/324,886

(22) Filed: Jul. 7, 2014

(65) Prior Publication Data

US 2016/0006402 A1  Jan. 7, 2016

(51) Int. Cl.
*H03F 3/38* (2006.01)
*H03F 3/217* (2006.01)
*H03F 1/32* (2006.01)

(52) U.S. Cl.
CPC .............. *H03F 1/32* (2013.01); *H03F 1/3205* (2013.01); *H03F 3/2173* (2013.01); *H03F 2200/351* (2013.01)

(58) Field of Classification Search
CPC .............. H03F 1/02; H03F 3/16; H03F 3/19; H03F 3/24; H03F 3/211; H03F 3/217; H03F 3/2171; H03F 3/2173; H03F 3/245; H03F 3/45479; H03F 2200/03; H03F 2200/331; H03F 2200/451; H03F 2203/45078; H03F 2203/45441; H03K 3/012; H03K 5/12; H03H 11/1217; H04L 27/2053; H02P 6/006; H02P 6/182; H02P 23/0036; H04R 1/1083; H04R 3/00; H04R 5/04; H04R 2460/01; G01B 33/0023; G06F 3/016; G06F 3/0416; Y10T 29/49002

USPC .......... 330/9, 10, 51, 124 R, 207, 251, 277; 332/109; 375/238; 323/284; 324/655; 327/110, 552, 568; 381/120
See application file for complete search history.

(56) References Cited

U.S. PATENT DOCUMENTS

| | | | |
|---|---|---|---|
| 5,497,062 A | 3/1996 | Fenstermacher et al. | |
| 7,518,450 B2 * | 4/2009 | Wendt | H03F 1/32 326/83 |
| 2007/0013356 A1 | 1/2007 | Qiu et al. | |
| 2008/0106917 A1 | 5/2008 | Holt | |
| 2010/0201443 A1 * | 8/2010 | Kaya | H03F 3/217 330/251 |

OTHER PUBLICATIONS

International Search Report for PCT/US 2015/039442, mailed Oct. 8, 2015 (2 pages).

* cited by examiner

*Primary Examiner* — Steven J Mottola
*Assistant Examiner* — Hafizur Rahman
(74) *Attorney, Agent, or Firm* — Gregory J. Albin; Frank D. Cimino (57) ABSTRACT

A circuit includes an amplifier output stage that includes a high switch and a low switch that generates a pulse width modulated (PWM) output signal to provide a load current to a load in response to a PWM input signal. The circuit includes a high gate drive that drives the high switch with a PWM high drive signal derived from the PWM input signal. This includes a low gate drive that drives the low switch with a PWM low drive signal derived from the PWM input signal. The circuit includes an edge corrector that adjusts at least one of a leading edge and a trailing edge of the PWM input signal to compensate for response time differences with respect to a direction of the load current to the load.

17 Claims, 6 Drawing Sheets

EDGE CORRECTION TO MITIGATE TOTAL HARMONIC DISTORTION IN CLASS D AMPLIFIER

TECHNICAL FIELD

This disclosure relates to amplifier circuits, and more particularly to an edge corrector that adjusts pulse width modulated (PWM) input signal timing to mitigate total harmonic distortion in a Class D amplifier output stage.

BACKGROUND

Class D amplifiers operate by generating a variable duty cycle square wave of which the low-frequency portion is essentially the wanted output signal, and of which the high-frequency portion serves no purpose other than to make the wave-form binary so it can be amplified by switching power devices in an output stage of the amplifier. A passive low-pass filter removes the unwanted high-frequency components and recovers the desired low-frequency signal. To maintain high efficiency, the filter is typically made with reactive components which store the excess energy until it is needed instead of converting some of it into heat.

Theoretical power efficiency of class D amplifiers is 100%. That is to say, all of the power supplied to it is delivered to the load and none is turned to heat. This is because an ideal switch in its on state will conduct all the current but has no voltage across it, and hence no heat would be dissipated. And when it is off, it will have the full supply voltage across it, but no current flows through it. Again, no heat would be dissipated. Real-world power MOSFET's are not ideal switches however and practical efficiencies well over 90% are common. Timing between switches must also be controlled such that both switches are not turned on at the same time which could damage the output stage. This time where one switch is turned off before the other is turned on is referred to as dead time.

One problem with operation of Class D amplifiers relates to the effects of the direction of load current on the PWM output signal of the amplifier. Thus, one direction of output current (e.g., high to low) can cause differences in the PWM output signal timing that are different from that when the output current changes in the opposite direction (e.g., low to high). Such differences in timing leads to a distortion in the output signal quality of the amplifier and is referred to as total harmonic distortion (THD).

SUMMARY

This disclosure relates to an edge corrector that adjusts pulse width modulated (PWM) input signal timing to mitigate total harmonic distortion in a Class D amplifier output stage. In one aspect, a circuit includes an amplifier output stage that includes a high switch and a low switch that generates a pulse width modulated (PWM) output signal to provide a load current to a load in response to a PWM input signal. The circuit includes a high gate drive that drives the high switch with a PWM high drive signal derived from the PWM input signal. This includes a low gate drive that drives the low switch with a PWM low drive signal derived from the PWM input signal. The circuit includes an edge corrector that adjusts at least one of a leading edge and a trailing edge of the PWM input signal to compensate for response time differences with respect to a direction of the load current to the load.

In another aspect, a circuit includes an amplifier output stage that includes a high switch and a low switch that generates a pulse width modulated (PWM) output signal to provide a load current to a load in response to a PWM input signal. The circuit includes a high gate drive that drives the high switch with a PWM high drive signal derived from the PWM input signal. This includes a low gate drive that drives the low switch with a PWM low drive signal derived from the PWM input signal. The circuit includes a timing controller that controls the timing of the PWM high drive signal and the PWM low drive signal. The timing controller measures a first time when the PWM low drive signal transitions with respect to the PWM output signal going to a first state and measures a second time when the PWM high drive signal transitions with respect to the PWM output signal going to a second state. An edge corrector adds the measured first time to a leading edge of the PWM input signal and subtracts the measured second time from a falling edge of the PWM input signal to compensate for response time differences with respect to a direction of the load current to the load.

In yet another aspect, a method includes driving a high switch with a pulse width modulated (PWM) high drive signal derived from a PWM input signal. This includes driving a low switch with respect to a PWM low drive signal derived from the PWM input signal. The method include measuring a first time when the PWM low drive signal transitions with respect to the PWM output signal going to a first state. This includes measuring a second time when the PWM high drive signal transitions with respect to the PWM output signal going to a second state. The method includes adding the measured first time to a trailing edge of the PWM input signal and subtracting the measured second time from a leading edge of the next PWM input signal.

DETAILED DESCRIPTION

This disclosure relates to an edge corrector that adjusts pulse width modulated (PWM) input signal timing to mitigate total harmonic distortion in a Class D amplifier output stage. When a switching pulse width modulated (PWM) output stage changes states (e.g., high to low or low to high), a timing distortion can occur in the PWM output signal where the modulation of the output signal can change based on the direction of load current. The timing distortion affects the quality of the output signal and is referred to as total harmonic distortion (THD). The edge corrector compensates for the timing distortion by adjusting a leading edge and a trailing edge of the PWM input signal to mitigate total harmonic distortion (THD) in the PWM output signal.

When the PWM output signal is commanded to a first state (e.g., low to high), the response time between the command and output transition to the first state may be measured as a first time T1. When the PWM output signal is commanded to a second state (e.g., high to low), the response time between the command and output transition to the second state may be measured as a second time T2. Without edge correction as disclosed herein, the response time between T1 and T2 may be different which can thereby increase THD in the PWM output signal. By adjusting the edges of the PWM input signal via the edge corrector, response time differences between T1 and T2 can be reduced and therefore reduce THD in the PWM output signal.

Response time compensation can be determined by measuring output signal transitions with respect to the drive signals that command the transitions. For example, this can include measuring a first time period when a PWM low drive signal (e.g., signal to drive gates of output stage transistors) transitions with respect to the PWM output signal going to a first state (e.g., high). A second time period can be measured when a PWM high drive signal transitions with respect to the PWM output signal going to a second state (e.g., low). After measurement, the measured first time period can be added to a trailing edge of a PWM input signal that contains the information to be amplified (e.g., audio data). The measured second time period can be subtracted from a leading edge of the next PWM input signal to cause a timing adjustment to the amplifier PWM input signal. The edge corrections mitigate total harmonic distortion (THD) in the PWM output signal by correcting for response time differences caused by changes in load current direction.

Figure 1:
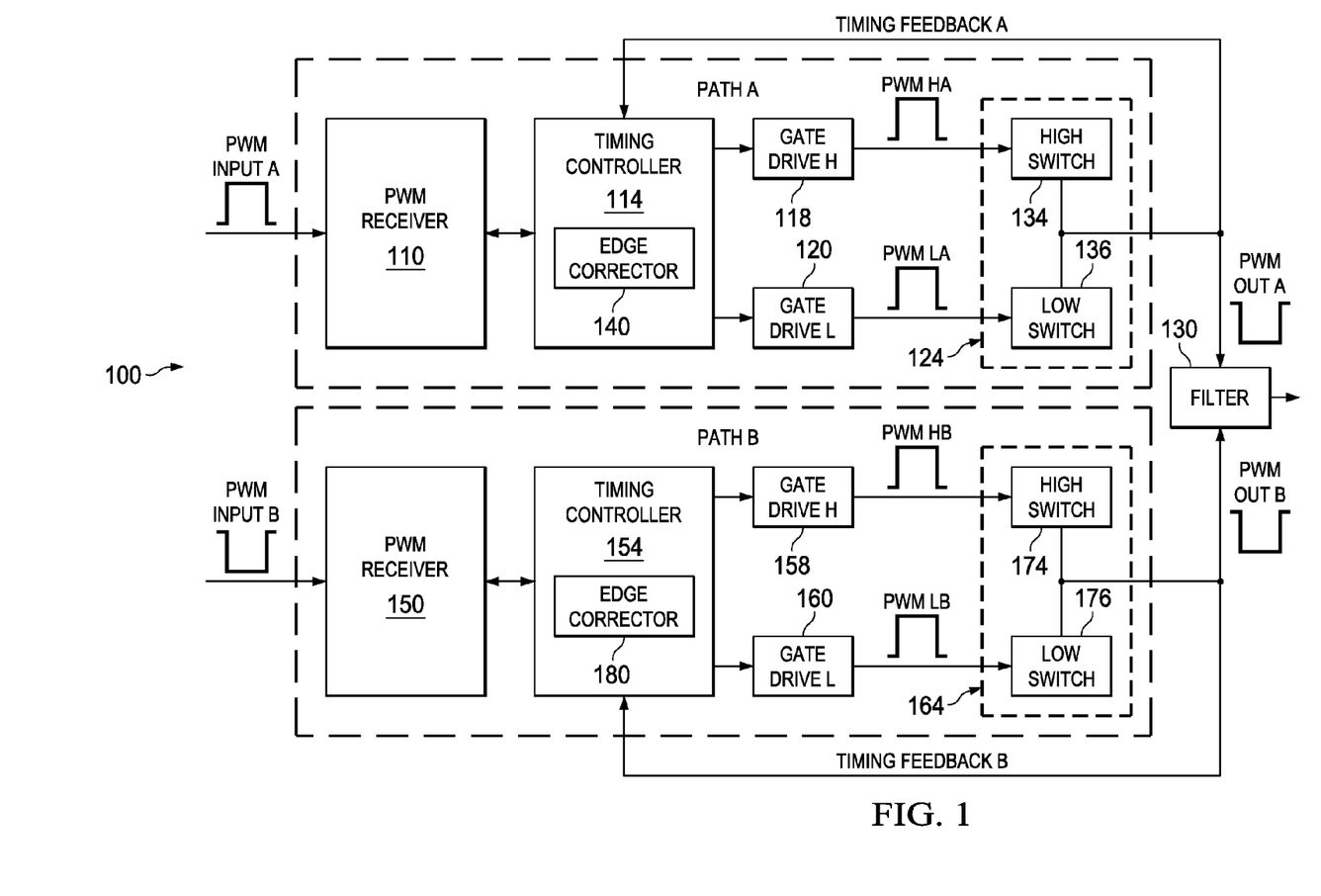
FIG. 1 illustrates an example of schematic block diagram of a circuit that adjusts pulse width modulated (PWM) input signal timing to mitigate total harmonic distortion in a Class D amplifier output stage.

FIG. 1 illustrates an example of schematic block diagram of a circuit 100 that adjusts pulse width modulated (PWM) input signal timing to mitigate total harmonic distortion in a Class D amplifier output stage. As used herein, the term circuit can include a collection of active and/or passive elements that perform a circuit function such as an amplifier or controller. The term circuit can also include an integrated circuit where all the circuit elements are fabricated on a common substrate, for example.

The circuit 100 can include two paths for amplifying a pulse width modulated (PWM) input signal. Path A amplifies PWM INPUT A and Path B amplifies PWM INPUT signal B. Although two paths A an B are shown to support a full bridge amplifier configuration, a single path (A or B) could be employed to support a half bridge amplifier configuration. With respect to path A, a PWM receiver 110 receives input signal PWM INPUT A and passes the signal to a timing controller 114. Output from the timing controller 114 drives a high gate drive 118 and a low gate drive 120. Output from the high and low gate drives 118 and 120 are fed to an amplifier output stage 124 which generates an amplified output signal PWM OUT A which is fed to a filter 130.

The amplifier output stage 124 includes a high switch 134 and a low switch 136 to generate the amplified pulse width modulated output signal PWM OUT A for the amplifier output stage 124. The high gate drive 118 and a low gate drive 120 drive the high switch 134 and the low switch 136 respectively with respect to a PWM high drive signal (PWM HA) for the high gate drive 118 and a PWM low drive signal (PWM LA) for the low gate drive 120. The timing controller 114 (e.g., analog and/or digital controller) controls the timing of the high gate drive 118 and the low gate drive with 120 respect to a dead time between the on time of the high switch 134 and the on time of the low switch 136. Thus, the timing controller 114 includes dead time logic or instructions to ensure that at least one of the high or low switches is off before turning the other one on. Typically, the timing adjustments described herein as applied to the input signal PWM INPUT A occur before the dead time logic has computed the next switching cycle.

In one example, the timing controller 114 measures a first time when the PWM low drive signal PWM LA transitions (e.g., goes low) with respect to the PWM output signal PWM OUT A going to a first state (e.g., high). As shown, timing feedback A is supplied by feeding back the output to the timing controller 114. The timing controller 114 also measures a second time when the PWM high drive signal PWM HA transitions (e.g., goes low) with respect to the PWM output signal PWM OUT A going to a second state (e.g., low). An edge corrector 140 in the timing controller 114 mitigates total harmonic distortion (THD) in the PWM output signal PWM OUT A by adjusting at least one edge of the PWM input signal. This includes adding the measured first time to a trailing edge of a PWM input signal PWM INPUT A and subtracting the measured second time from a leading edge of the next PWM input signal. Such additions or subtraction to the PWM input signal edges can occur in the PWM receiver 110 based off an adjustment command (e.g., advance or delay leading and/or trailing edge of input signal) from the timing controller 110. In an alternative example, the timing controller 114 can also perform the leading edge and trailing edge adjustments to the PWM input signal PWM INPUT A.

With respect to path B, a PWM receiver 150 receives input signal PWM INPUT B and passes the signal to a timing controller 154. Output from the timing controller 154 drives a high gate drive 158 and a low gate drive 160. Output from the high and low gate drives 158 and 160 are fed to an amplifier output stage 164 which generates an amplified output signal PWM OUT B which is fed to the filter 130. The amplifier output stage 164 includes a high switch 174 and a low switch 176 to generate the amplified pulse width modulated output signal PWM OUT B for the amplifier output stage 164. The high gate drive 158 and a low gate drive 160 drive the high switch 174 and the low switch 176 respectively with respect to a PWM high drive signal (PWM HB) for the high gate drive 158 and a PWM low drive signal (PWM LB) for the low gate drive 160. The timing controller 154 (e.g., analog and/or digital controller) controls the timing of the high gate drive 158 and the low gate drive with 160 respect to a dead time between the on time of the high switch 174 and the on time of the low switch 176.

In one example, the timing controller 154 measures a first time when the PWM low drive signal PWM LB transitions with respect to the PWM output signal PWM OUT B going to a first state (e.g., high). As shown, timing feedback B is supplied by feeding back the output to the timing controller 154. The timing controller 154 also measures a second time when the PWM high drive signal PWM HB transitions with respect to the PWM output signal PWM OUT B going low. An edge corrector 180 in the timing controller 154 mitigates total harmonic distortion (THD) in the PWM output signal PWM OUT B by adjusting at least one edge of the PWM input signal. This includes adding the measured first time to a trailing edge of a PWM input signal PWM INPUT B and subtracting the measured second time from a leading edge of the next PWM input signal.

As noted above with respect to path A, such additions or subtraction to the PWM input signal edges can occur in the PWM receiver 150 based off an adjustment command from the timing controller 154. In an alternative example, the timing controller 154 can also perform the leading edge and trailing edge adjustments to the PWM input signal PWM INPUT B. As will be illustrated and described below with respect to FIGS. 4 and 5, the edge correction methods described herein can be applied to open loop or closed loop PWM circuits.

Figure 2:
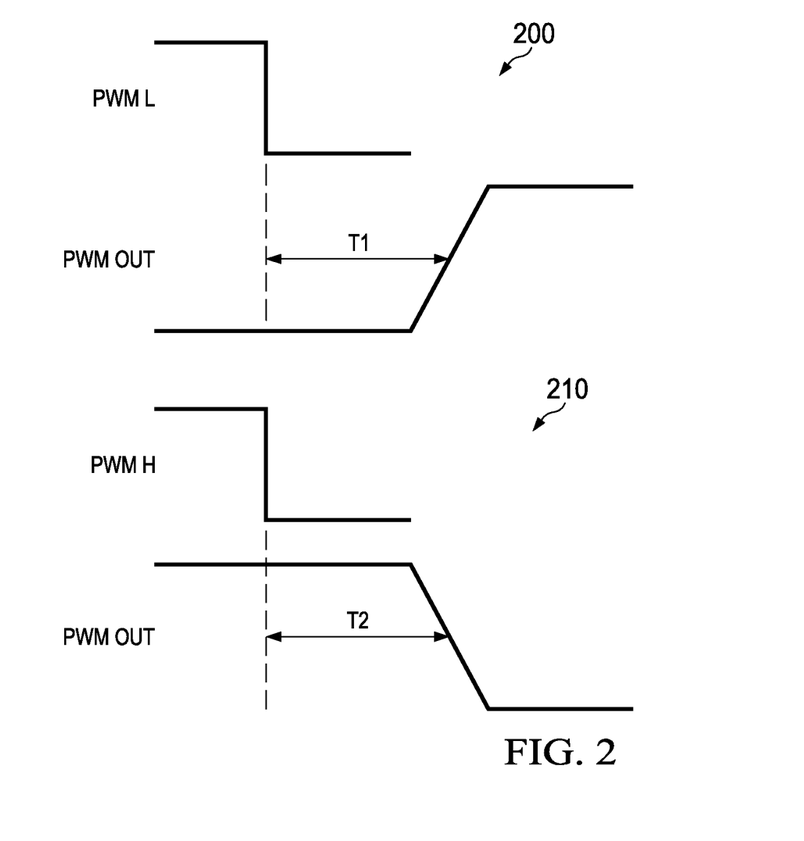
FIG. 2 illustrates example measurement signal diagrams for measuring edge correction time periods to mitigate total harmonic distortion in a Class D amplifier output stage.

FIG. 2 illustrates example measurement signal diagrams for measuring edge correction time periods to mitigate total harmonic distortion in a Class D amplifier output stage. At 200, a first time period measurement is depicted and shown as T1. As noted above, the timing controller measures the first time T1 when the PWM low drive signal transitions (e.g., goes low) with respect to the PWM output signal going to a first state (e.g., high). A threshold can be selected on the output signal to determine when to measure the time T1 (e.g., when output has risen to 50% of full scale value). At 210, a second time period measurement occurs and is designated as T2. The second time period T2 is measured when the PWM high drive signal transitions (e.g., goes low) with respect to the PWM output signal going to a second state (e.g., low). After the respective measurements, the edge corrector in the timing controller mitigates total harmonic distortion (THD) in the PWM output signal by adding the measured first time T1 to a trailing edge of a PWM input signal and subtracting the measured second time from a leading edge of the next PWM input signal as will be illustrated and described below with respect to FIG. 3.

Figure 3:
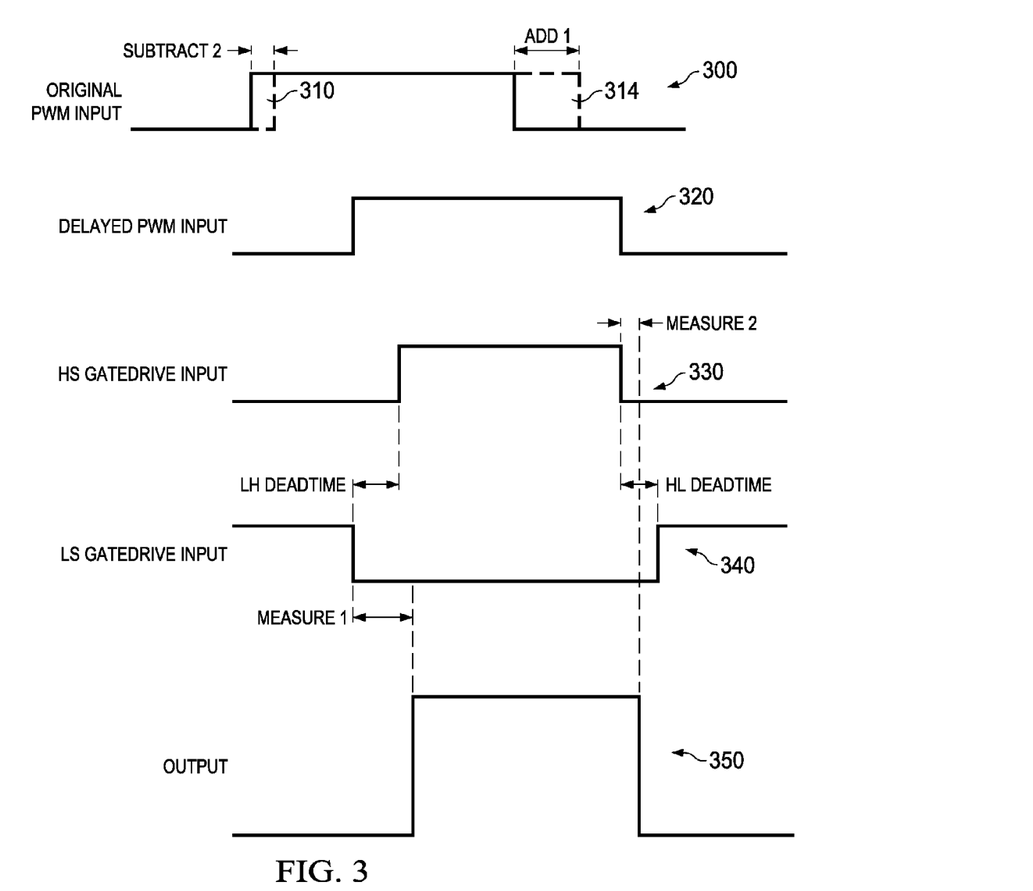
FIG. 3 illustrates example adjustment signal diagrams depicting signal edge corrections to mitigate total harmonic distortion in a Class D amplifier output stage.

FIG. 3 illustrates example adjustment signal diagrams depicting signal edge corrections to mitigate total harmonic distortion in a Class D amplifier output stage. At 300, an initial PWM INPUT signal has time subtracted from its leading edge at 310 and time added to its trailing edge at 314. Such timing additions and subtractions lead to a delayed input signal depicted at 320. Diagram 330 illustrates the measurement described as T2 above with respect to FIG. 2 whereas diagram 340 illustrates the measurement described as T1 with respect to FIG. 2. The diagram 350 illustrates an example output signal from which the respective measurements T1 and T2 are referenced to.

Figure 4:
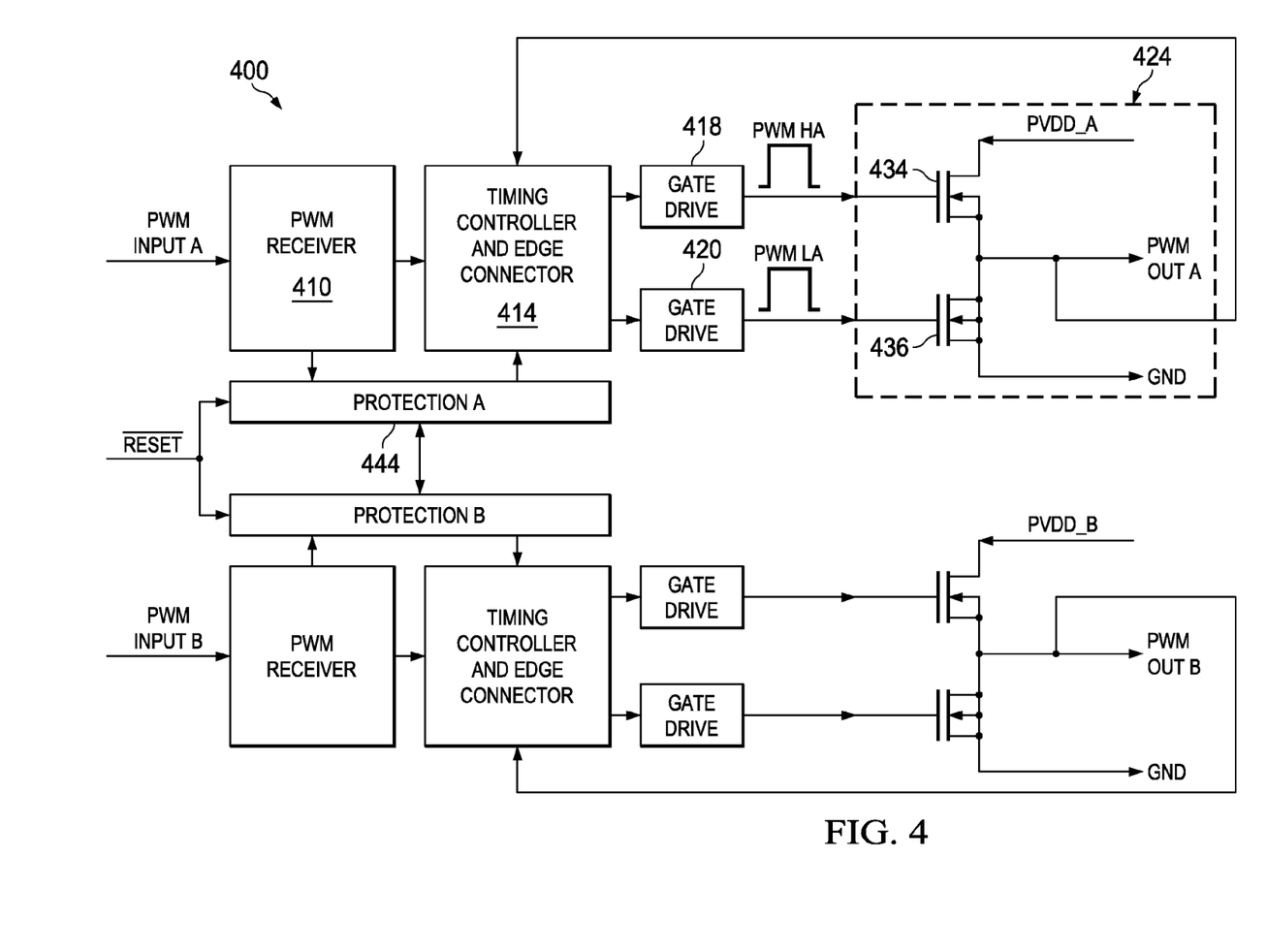
FIG. 4 illustrates an example of an open loop circuit that adjusts pulse width modulated (PWM) input signal timing to mitigate total harmonic distortion in a Class D amplifier output stage.

FIG. 4 illustrates an example of an open loop circuit 400 that adjusts pulse width modulated (PWM) input signal timing to mitigate total harmonic distortion in a Class D amplifier output stage. For purposes of brevity, only an A-side path will be described however the B-side path operates substantially the same as described above with respect to FIG. 1. A PWM receiver 410 receives input signal PWM INPUT A and passes the signal to a timing controller 414. Output from the timing controller 414 drives a high gate drive 418 and a low gate drive 420. Output from the high and low gate drives 418 and 420 are fed to an amplifier output stage 424 which generates an amplified output signal PWM OUT A.

The amplifier output stage 424 includes a high switch 434 connected to supply rail PVDD_A and a low switch 436 connected to ground GND to generate the amplified pulse width modulated output signal PWM OUT A for the amplifier output stage 424. The high gate drive 418 and a low gate drive 420 drive the high switch 434 and the low switch 436 respectively with respect to a PWM high drive signal (PWM HA) for the high gate drive 418 and a PWM low drive signal (PWM LA) for the low gate drive 420. The timing controller 414 controls the timing of the high gate drive 418 and the low gate drive with 420 respect to a dead time between the on time of the high switch 434 and the on time of the low switch 436. The timing controller 414 includes dead time logic or instructions to ensure that at least one of the high or low switches is off before turning the other one on. Typically, the timing adjustments described herein as applied to the input signal PWM INPUT A occur before the dead time logic has computed the next switching cycle.

In one example, the timing controller 414 measures a first time when the PWM low drive signal PWM LA transitions with respect to the PWM output signal PWM OUT A going to a first state. The timing controller 414 also measures a second time when the PWM high drive signal PWM HA transitions with respect to the PWM output signal PWM OUT A going to a second state opposite from the first state. An edge corrector in the timing controller 414 mitigates total harmonic distortion (THD) in the PWM output signal PWM OUT A by adding the measured first time to a trailing edge of a PWM input signal PWM INPUT A and subtracting the measured second time from a leading edge of the next PWM input signal. Such additions or subtraction to the PWM input signal edges can occur in the PWM receiver 410 based off an adjustment command (e.g., advance or delay leading and/or trailing edge of input signal) from the timing controller 410. In an alternative example, the timing controller 414 can also perform the leading edge and trailing edge adjustments to the PWM input signal PWM INPUT A. A protection circuit 444 can be provided to shutdown the timing controller 414 in response to a reset signal input RESET. Reset can be asserted for example if excessive current is requested from the output of the amplifier stage 464, for example.

Figure 5:
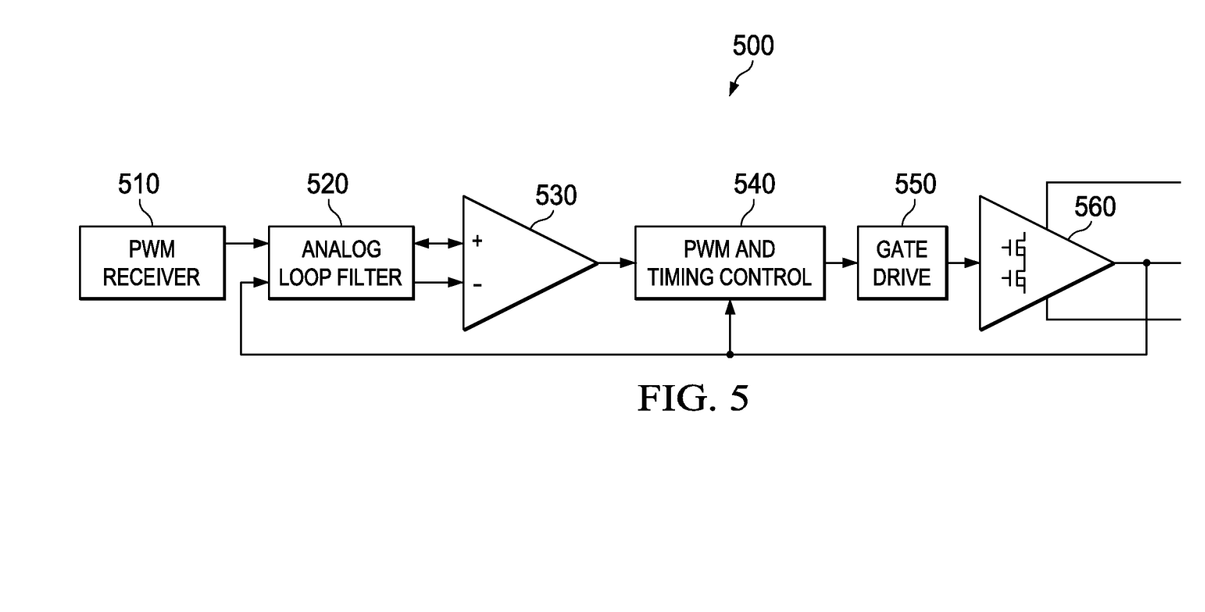
FIG. 5 illustrates an example of a closed loop circuit that adjusts pulse width modulated (PWM) input signal timing to mitigate total harmonic distortion in a Class D amplifier output stage.

FIG. 5 illustrates an example of a closed loop circuit 500 that adjusts pulse width modulated (PWM) input signal timing to mitigate total harmonic distortion in a Class D amplifier output stage. In this example, output from a PWM receiver 510 is fed to an analog loop filter 520 which drives amplifier 530. Output from amplifier 530 drives timing controller 540 which drives a gate drive 550 (e.g., includes both high and low drives) which in turn drives high and low switches depicted in amplifier 560. In this example, feedback to measure for edge correction adjustments is fed to the timing controller and employed as previously described. Output feedback is also fed to the analog loop filter 520 to close the loop around the PWM signal itself. Thus, the circuit 500 depicts a closed loop system to generate an amplified PWM output in addition to the edge correction previously described to mitigate total harmonic distortion at the output of amplifier 560.

Figure 6:
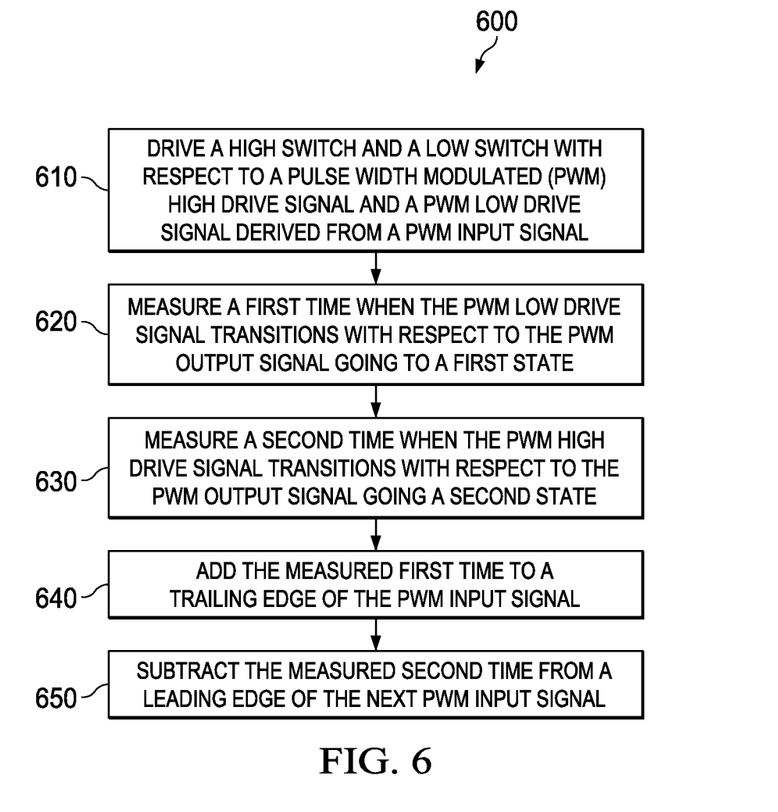
FIG. 6 illustrates an example method that adjusts pulse width modulated (PWM) input signal timing to mitigate total harmonic distortion in a Class D amplifier output stage.

In view of the foregoing structural and functional features described above, a methodology in accordance with various aspects of the present invention will be better appreciated with reference to FIG. 6. While, for purposes of simplicity of explanation, the methodology is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention. The various acts of the method can be executed automatically such as via a processor, computer, and/or controller configured with executable instructions to carry out the various acts or commands described herein.

FIG. 6 illustrates an example method 600 that adjusts pulse width modulated (PWM) input signal timing to mitigate total harmonic distortion in a Class D amplifier output stage. At 610, the method 600 includes driving a high switch and a low switch with respect to a pulse width modulated (PWM) high drive signal and a PWM low drive signal and in response to a PWM input signal (e.g., via gate drives 118 and 120 of FIG. 1). At 620, the method 600 includes measuring a first time (e.g., T1 of FIG. 2) when the PWM low drive signal transitions with respect to the PWM output signal going to a first state (e.g., via timing controller 114 of FIG. 1).

At 630, the method 600 includes measuring a second time (e.g., T2) when the PWM high drive signal transitions with respect to the PWM output signal going to a second state opposite from the first state (e.g., via timing controller 114 of FIG. 1). At 640, the method 600 includes adding the measured first time to a trailing edge of a PWM input signal (e.g., via edge corrector 140 of FIG. 1). At 650, the method 600 includes subtracting the measured second time from a leading edge of the next PWM input signal to mitigate total harmonic distortion (THD) in the PWM output signal (e.g., via edge corrector 140 of FIG. 1). As noted above, the edge correction methods described herein can be applied to open loop or closed loop PWM circuits.

Although not shown, the method 600 can also include providing feedback from the PWM output signal to a previous measurement stage to adjust a leading edge and a trailing edge of a PWM input signal to mitigate total harmonic distortion in the PWM output signal. This can include filtering the PWM input signal from a PWM receiver to provide the PWM input signal to a succeeding timing measurement stage. The method can also include employing a measurement threshold on the PWM output signal to determine when to measure the first time and the second time with respect to a rising or leading edge of the PWM output signal. This can include adjusting the first time or the second time in at least a first stage or a second stage following the reception of the PWM input signal. The method can also include delaying the PWM input signal after adjusting the first time or the second time.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    an amplifier output stage that includes a high switch and a low switch that generates a pulse width modulated (PWM) output signal to provide a load current to a load in response to a PWM input signal;
    a high gate drive that drives the high switch with a PWM high drive signal derived from the PWM input signal;
    a low gate drive that drives the low switch with a PWM low drive signal derived from the PWM input signal; and
    a timing controller that measures a first time T1 when the PWM low drive signal transitions with respect to the PWM output signal going to a first state and measures a second time T2 when the PWM high drive signal transitions with respect to the PWM output signal to a second state,
    wherein the timing controller includes an edge corrector that adds the measured first time T1 to a trailing edge of the PWM input signal, and subtracts the measured second time T2 from a leading edge of the next PWM input signal to compensate for response time differences with respect to a direction of the load current to the load.

2. The circuit of claim 1, wherein feedback from the PWM output signal is provided to the timing controller to adjust a leading edge and a trailing edge of the PWM input signal to compensate for response time differences with respect to a direction of the load current to the load.

3. The circuit of claim 2, further comprising a PWM receiver to receive the PWM input signal and provide the PWM input signal to the timing controller.

4. The circuit of claim 3, further comprising an analog loop filter that receives the PWM input signal from the PWM receiver to provide the PWM input signal to the timing controller.

5. The circuit of claim 4, wherein feedback from the PWM output signal is provided to the analog loop filter to control the PWM input signal.

6. The circuit of claim 1, wherein the measured first time T1 or the measured second time T2 is added or subtracted to the PWM input signal in a PWM receiver or the timing controller.

7. The circuit of claim 1, further comprising a second amplifier output stage, a second high gate drive, a second low gate drive, and a second edge corrector to provide a second gain path in a full bridge amplifier configuration.

8. A circuit comprising:
    an amplifier output stage that includes a high switch and a low switch that generates a pulse width modulated (PWM) output signal to provide a load current to a load in response to a PWM input signal;
    a high gate drive that drives the high switch with a PWM high drive signal derived from the PWM input signal;
    a low gate drive that drives the low switch with a PWM low drive signal derived from the PWM input signal;
    a timing controller that controls the timing of the PWM high drive signal and the PWM low drive signal, wherein the timing controller measures a first time when the PWM low drive signal transitions with respect to the PWM output signal going to a first state, measures a second time when the PWM high drive signal transitions with respect to the PWM output signal going to a second state, and employs a measurement threshold on the PWM output signal to determine when to measure the first time and the second time with respect to a rising or leading edge of the PWM output signal; and
    an edge corrector that adds the measured first time to a trailing edge of the PWM input signal and subtracts the measured second time from a leading edge of the next PWM input signal to compensate for response time differences with respect to a direction of the load current to the load.

9. The circuit of claim 8, wherein feedback from the PWM output signal is provided to the timing controller to adjust a leading edge and a trailing edge of a PWM input signal to compensate for response time differences with respect to a direction of the load current to the load.

10. The circuit of claim 9, further comprising a PWM receiver to receive the PWM input signal and provide the PWM input signal to the timing controller.

11. The circuit of claim 10, further comprising an analog loop filter that receives the PWM input signal from the PWM receiver to provide the PWM input signal to the timing controller.

12. The circuit of claim 11, wherein feedback from the PWM output signal is provided to the analog loop filter to control the PWM input signal.

13. The circuit of claim 8, further comprising a second amplifier output stage, a second high gate drive, a second low gate drive, and a second edge corrector to provide a second gain path in a full bridge amplifier configuration.

14. A method comprising:
  driving a high switch with a pulse width modulated (PWM) high drive signal derived from a PWM input signal;
  driving a low switch with respect to a PWM low drive signal derived from the PWM input signal;
  measuring, by a controller, a first time when the PWM low drive signal transitions with respect to the PWM output signal going to a first state;
  measuring, by the controller, a second time when the PWM high drive signal transitions with respect to the PWM output signal going to a second state;
  adding, by the controller, the measured first time to a trailing edge of the PWM input signal;
  subtracting, by the controller, the measured second time from a leading edge of the next PWM input signal; and
  employing a measurement threshold on the PWM output signal to determine when to measure the first time and the second time with respect to a rising or leading edge of the PWM output signal.

15. The method of claim 14, further comprising providing feedback from the PWM output signal to a previous measurement stage to adjust a leading edge and a trailing edge of a PWM input signal.

16. The method of claim 14, further comprising filtering the PWM input signal from a PWM receiver to provide the PWM input signal to a succeeding timing measurement stage.

17. The method of claim 14, further comprising adjusting the first time or the second time in at least a first stage or a second stage following the reception of the PWM input signal.

* * * * *